(12) United States Patent
Cheng et al.

(10) Patent No.: US 9,263,626 B1
(45) Date of Patent: Feb. 16, 2016

(54) CRYSTALLINE THIN FILM PHOTOVOLTAIC CELL

(71) Applicant: International Business Machines Corporation, Armonk, NY (US)

(72) Inventors: Cheng-Wei Cheng, White Plains, NY (US); Ning Li, White Plains, NY (US); Devendra K. Sadana, Pleasantville, NY (US); Kuen-Ting Shiu, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/609,001

(22) Filed: Jan. 29, 2015

(51) Int. Cl.
| | |
|---|---|
| *H01L 21/00* | (2006.01) |
| *H01L 31/18* | (2006.01) |
| *H01L 31/0216* | (2014.01) |
| *H01L 31/20* | (2006.01) |
| *H01L 31/077* | (2012.01) |
| *H01L 27/146* | (2006.01) |
| *H01L 21/02* | (2006.01) |

(52) U.S. Cl.
CPC ...... *H01L 31/1896* (2013.01); *H01L 31/02168* (2013.01); *H01L 31/077* (2013.01); *H01L 31/184* (2013.01); *H01L 31/1808* (2013.01); *H01L 31/1844* (2013.01); *H01L 31/1884* (2013.01); *H01L 31/20* (2013.01); *H01L 21/02672* (2013.01); *H01L 27/14685* (2013.01)

(58) Field of Classification Search
CPC ................................................ H01L 21/02672
USPC .......................................................... 438/97
See application file for complete search history.

(56) References Cited

U.S. PATENT DOCUMENTS

| | | | |
|---|---|---|---|
| 5,512,108 A | 4/1996 | Noreen | |
| 6,452,091 B1 | 9/2002 | Nakagawa et al. | |
| 7,056,808 B2 * | 6/2006 | Henley .............. | H01L 21/26506 257/E21.335 |
| 8,252,668 B2 | 8/2012 | Yamaguchi et al. | |
| 8,846,174 B2 * | 9/2014 | Leighton ................. | B32B 18/00 428/68 |

(Continued)

FOREIGN PATENT DOCUMENTS

| | | |
|---|---|---|
| CN | 102104087 B | 11/2012 |
| JP | 201040972 | 2/2010 |

(Continued)

OTHER PUBLICATIONS

Coutts, T. J., et al., "High efficiency indium tin oxide/indium phosphide solar cells", Applied Physics Letters, Jan. 15, 1985, 46, 2, pp. 164-166.

Li, N., et al., "Improved power conversion efficiency of InP solar cells using organic window layers", Applied Physics Letters, Feb. 2, 2011, 98, pp. 053504-1 to 053504-3.

(Continued)

*Primary Examiner* — Chandra Chaudhari
(74) *Attorney, Agent, or Firm* — Scully, Scott, Murphy & Presser, P.C.; Louis J. Percello, Esq.

(57) ABSTRACT

A material stack including an ohmic contact layer and a single crystalline semiconductor base substrate of a first conductivity type and having a surface Fermi level pinned close to a band edge (either the conduction band or valence band) is first provided. A stressor layer is then formed above the ohmic contact layer and a material portion of the single crystalline semiconductor base substrate is removed by a process referred to as spalling. A transparent conductive oxide layer is then formed on an exposed surface of the material portion of the single crystalline semiconductor base substrate that was removed by spalling.

20 Claims, 5 Drawing Sheets

(56) References Cited

U.S. PATENT DOCUMENTS

2009/0255580 A1    10/2009  Dasgupta et al.
2010/0009492 A1    1/2010   Vu et al.
2012/0260971 A1    10/2012  Chen et al.

FOREIGN PATENT DOCUMENTS

KR    1020110036061         4/2011
KR      101101277          12/2011
WO    WO2011066029 A2       6/2011
WO    WO2012037758          3/2012

OTHER PUBLICATIONS

Li, X., et al., "Highefficiency indium tin oxide/indium phosphide solar cells", Applied Physics Letters, Jun. 26, 1989, 54, pp. 2674-2676.

Shiu, K.-T., et al., "Ultrathin film, high specific power InP solar cells on flexible plastic substrates", Applied Physics Letters, Dec. 2, 2009, 95, pp. 223503-1 to 223503-3.

Thorton, J. A., et al., "Internal stresses in titanium, nickel, molybdenum, and tantalum films deposited by cylindrical magnetron sputtering", J. Vac. Sci. Technol., 14, Jan./Feb. 1977, p. 164-168.

* cited by examiner

CRYSTALLINE THIN FILM PHOTOVOLTAIC CELL

BACKGROUND

The present application relates to photovoltaic cells, and more particularly to a method of forming photovoltaic cells that include a thin film structure including an ohmic contact layer and a single crystalline semiconductor material having a surface Fermi level pinned close to a band edge (either the conduction band or the valence band).

Photovoltaic cells are capable of converting solar energy into direct current electricity using semiconductor materials that exhibit a photovoltaic effect. Power generated by such photovoltaic cells has long been seen as a clean sustainable energy technology which draws upon the sun for energy. Although the energy conversion efficiency of photovoltaic cells keeps increasing, the dollar/watt figure-of-merit is still much higher than other energy sources.

Thin film photovoltaic cells, which typically have film thicknesses from a few nanometers to tens of micrometers, have advantages of reduced cost, flexibility, portability, and offer more applications as compared to their non-thin film counterparts. However, the thin film photovoltaic approaches existing today suffer from various shortcomings including, for example, low efficiency for amorphous silicon and organic solar cells, and high toxicity and material scarcity for CdTe and CIGS based devices. As such, there exists a need for developing a low-cost single-crystal semiconductor material thin film photovoltaic technology which overcomes the shortcomings of prior art thin film photovoltaic cells.

SUMMARY

A material stack including an ohmic contact layer and a single crystalline semiconductor base substrate of a first conductivity type and having a surface Fermi level pinned close to a band edge (either the conduction band or the valence band) is first provided. A stressor layer is then formed above the ohmic contact layer and a material portion of the single crystalline semiconductor base substrate is removed by a process referred to as spalling. Spalling is a layer transfer technology that uses mechanically guided fracture to separate a surface layer from a base substrate. The spalling process works by first forming a stressor layer, e.g., a Ni layer, atop a surface of a base substrate. A handle substrate can then be attached to the surface of the stressor layer. By using the handle layer to initiate and guide the fracture front that forms below the upper surface of the base substrate, a simple and robust layer transfer process can be achieved. A transparent conductive oxide layer is then formed on an exposed surface of the material portion of the single crystalline semiconductor base substrate that was removed by spalling.

In one embodiment of the present application, a method of forming a thin film photovoltaic cell is provided. The method of the present application includes providing a material stack of, from bottom to top, a single crystalline semiconductor base substrate of a first conductivity type and having a surface Fermi level pinned close to a band edge, and an ohmic contact layer. A stressor layer is then formed above the ohmic contact layer. Next, a portion of the single crystalline semiconductor base substrate is removed by performing a spalling process. The spalling process provides a thin film structure that comprises, from bottom to top, a spalled single crystalline semiconductor material portion of the single crystalline semiconductor base substrate, the ohmic contact layer and the stressor layer. At least a transparent conductive oxide layer is formed on an exposed surface of the spalled single crystalline semiconductor material portion.

DESCRIPTION

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

The present application provides a method of forming a thin film structure comprising a single crystalline semiconductor material and an ohmic contact layer without the need of employing an epitaxial growth process. The thin film structure provides a component of a photovoltaic cell. The method of the present application greatly reduces the cost and increases the throughput of fabricating photovoltaic cells. Moreover, the method of the present application can provide a photovoltaic cell that has high energy conversion efficiency. The thin film structure that is provided in the present application is flexible. Moreover, the present application avoids the need to use expensive and low throughput deposition processes such as, for example, epitaxial growth, in forming the photovoltaic cell.

Figure 1:
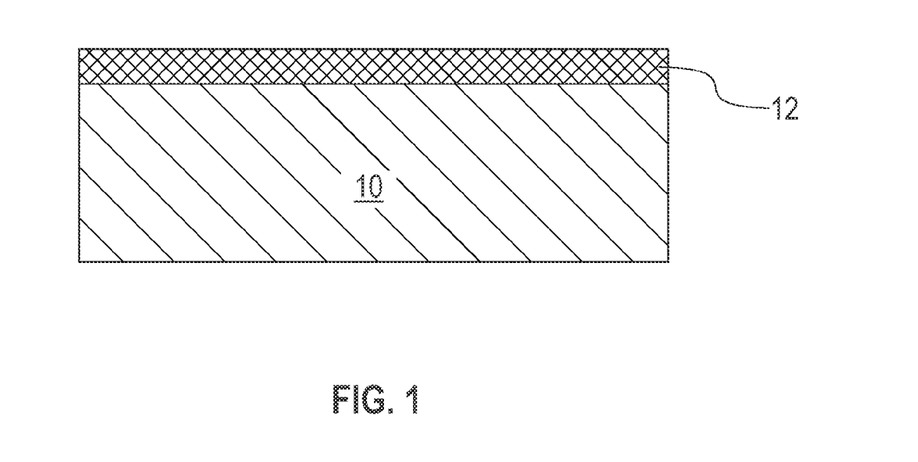
FIG. 1 is a cross sectional view of an exemplary structure including a material stack of, from bottom to top, a single crystalline semiconductor base substrate of a first conductivity type and having a surface Fermi level pinned close to a band edge (either the conduction band or the valence band) and an ohmic contact layer.

Referring first to FIG. 1, there is illustrated an exemplary structure including a material stack of, from bottom to top, a single crystalline semiconductor base substrate 10 of a first conductivity type and having a surface Fermi level pinned close to a band edge (either the conduction band or the valence band) and an ohmic contact layer 12.

The single crystalline semiconductor base substrate 10 that can be employed in the present application may comprise a bulk semiconductor material (i.e., the term "bulk" denotes that the entire substrate is comprised of a semiconductor material) having a surface Fermi level pinned close to a band edge (either the conduction band or the valence band) whose fracture toughness is less than that of the stressor layer to be subsequently formed. Fracture toughness is a property which describes the ability of a material containing a crack to resist fracture. Fracture toughness is denoted $K_{IC}$. The subscript IC denotes mode I crack opening under a normal tensile stress perpendicular to the crack, and c signifies that it is a critical value. Mode I fracture toughness is typically the most important value because spalling mode fracture usually occurs at a location in the substrate where mode II stress (shearing) is zero. Fracture toughness is a quantitative way of expressing a material's resistance to brittle fracture when a crack is present.

The term "surface Fermi level pinned close to a band edge" is used throughout the present application to denote a semiconductor material whose surface behaves like a heavily doped thin layer even though the bulk material is undoped or doped to the opposite type. By "close" it is meant within a few tenth of an eV. The difference of the Fermi level at the surface and the bulk of the semiconductor is induced by the termination of the periodic crystal structure at the semiconductor surface. Examples of semiconductor materials that have a surface Fermi level pinned close to a band edge and thus can be used in the present application as single crystalline semiconductor base substrate 10 include, but are not limited to, InP, InGaAs with a high indium (i.e., 70% or greater) concentration, or germanium. InP and InGaAs are examples of semiconductor materials whose surface Fermi levels are close to the conduction band, while germanium is an example of a semiconductor material whose surface Fermi level is pinned close to the valence band.

The term "single crystalline" is used throughout the present application to denote a semiconductor material in which the crystal lattice of the entire sample is continuous and unbroken to the edges of the sample, with no grain boundaries.

In one embodiment, the first conductivity type of the single crystalline semiconductor base substrate 10 is p-type. As used throughout the present application, "p-type" refers to the addition of impurities to an intrinsic semiconductor material that creates deficiencies of valence electrons. In one embodiment, the p-type dopant is present in a concentration ranging from $1E17$ atoms/cm$^3$ to $1E19$ atoms/cm$^3$. In another embodiment, the p-type dopant is present in a concentration ranging from $1E18$ atoms/cm$^3$ to $1E20$ atoms/cm$^3$.

In another embodiment, the first conductivity type of the single crystalline semiconductor base substrate 10 is n-type. As used throughout the present application, "n-type" refers to the addition of impurities that contributes free electrons to an intrinsic semiconductor. In one embodiment, the n-type dopant is present in a concentration ranging from $1E17$ atoms/cm$^3$ to $1E19$ atoms/cm$^3$. In another embodiment, the n-type dopant is present in a concentration ranging from $1E18$ atoms/cm$^3$ to $1E20$.

The material stack including the single crystalline semiconductor base substrate 10 and the ohmic contact layer 12 that can be employed in the present application is not formed by utilizing an epitaxial growth process. Instead, the material stack is formed by first providing an initial single crystalline semiconductor base substrate (the initial base substrate is compositionally identical to the single crystalline semiconductor base substrate 10 mentioned above). Next, ohmic contact layer 12 is formed within an upper portion of the initial single crystalline semiconductor base substrate; the remaining portion of the initial base substrate that is located beneath the ohmic contact layer 12 constituents the single crystalline semiconductor base substrate 10 of the present application. The dopant that provides the first conductivity type to the single crystalline semiconductor base substrate 10 can be introduced into the initial base substrate prior to ohmic contact layer 12 formation by ion implantation, gas phase doping or any other conventional process which can introduce dopants within an intrinsic semiconductor material. In some embodiments of the present application, the initial base substrate can be made by MOCVD (metalorgano chemical vapor deposition) with or without dopant addition.

The ohmic contact layer 12 of the present application includes a semiconductor metal alloy and dopants of the first conductivity type. The semiconductor component of the semiconductor metal alloy that provides the ohmic contact layer 12 is a same semiconductor material as that present in the single crystalline semiconductor base substrate 10. The metal component of the semiconductor metal alloy that provides the ohmic contact layer 12 includes one of the metal semiconductor alloy forming metals described herein below. The concentration of dopants within the ohmic contact layer 12 can be within, or below, the range mentioned above for the single crystalline semiconductor base substrate 10.

The ohmic contact layer 12 can be provided by first forming a layer of a metal semiconductor alloy forming metal (not shown) on a surface of the initial base substrate. The layer of metal semiconductor alloy forming metal (not shown) that can be used in providing the ohmic contact layer 12 comprises a transition metal such as, for example, titanium (Ti), nickel (Ni), platinum (Pt), palladium (Pd), cobalt (Co), gold (Au), tungsten (W), molybdenum (Mo), tantalum (Ta) or alloys thereof. The layer of metal semiconductor alloy forming metal can be formed by a deposition process including, for example, chemical vapor deposition, plasma enhanced chemical vapor deposition, plating or sputtering. In some embodiments, a co-deposition of metal semiconductor alloy forming metals can be used. In another embodiment, a first metal semiconductor alloy forming metal can be formed, followed by a second metal semiconductor alloy forming metal. The layer of metal semiconductor alloy metal that is formed can have a thickness from 5 nm to 15 nm. Other thicknesses that are greater than or lesser than the aforementioned thickness range can also be employed as the thickness of the layer of metal semiconductor alloy forming metal.

After providing the layer of metal semiconductor alloy forming metal and in some embodiments of the present application, a diffusion barrier (not shown) can be formed on an exposed upper surface of the layer of metal semiconductor alloy forming metal. In another embodiment of the present application, no diffusion barrier is provided on the exposed upper surface of the layer of metal semiconductor alloy forming metal. When present, the diffusion barrier can include a metal nitride such as, for example, TiN or TaN, and any deposition process including those mentioned above for providing the layer of metal semiconductor alloy forming metal may be used. When present, the diffusion barrier can have a thickness from 1 nm to 20 nm.

Next, an anneal is performed under conditions that are effective in causing the metal semiconductor alloy forming metal to diffuse into an upper portion of the initial base substrate forming the ohmic contact layer 12 and base substrate 10 shown in FIG. 1. The metal semiconductor alloy formation anneal that provides ohmic contact layer 12 may be performed in a single step or a two-step anneal can be used. In one embodiment and when nickel is used, the metal semiconductor alloy formation anneal that provides the ohmic contact layer 12 can be performed at a temperature of from 200° C. to 500° C. In another embodiment, temperatures greater than 500° C. can be used. The metal semiconductor alloy formation anneal is typically performed in an ambient including, for example, argon, helium, neon and/or nitrogen. The metal semiconductor alloy formation anneal can be performed utilizing a rapid thermal anneal, a spike anneal, a microwave anneal or a laser anneal. Following the metal semiconductor alloy formation anneal, the optional diffusion barrier and any unreacted metal semiconductor alloy forming metal can be removed utilizing one or more etch processes.

The ohmic contact layer 12 is a contiguous material layer (i.e., it contains no breaks or voids) that spans across the entirety of the single crystalline semiconductor base substrate 10. The ohmic contact layer 12 can have a thickness from 2 nm to 2000 nm. Other thickness that are lesser than or greater than aforementioned thickness region can also be employed. A non-rectifying junction is formed at the interface between the ohmic contact layer 12 and the single crystalline semiconductor base substrate 10. By "non-rectifying junction" it is meant an electrical junction between two conductors that has a linear current-voltage (I-V) curve as with Ohm's Law. Ohmic contacts are used to allow charge to flow easily in both directions between the two conductors, without blocking due to rectification or excess power dissipation due to voltage thresholds.

Figure 2:
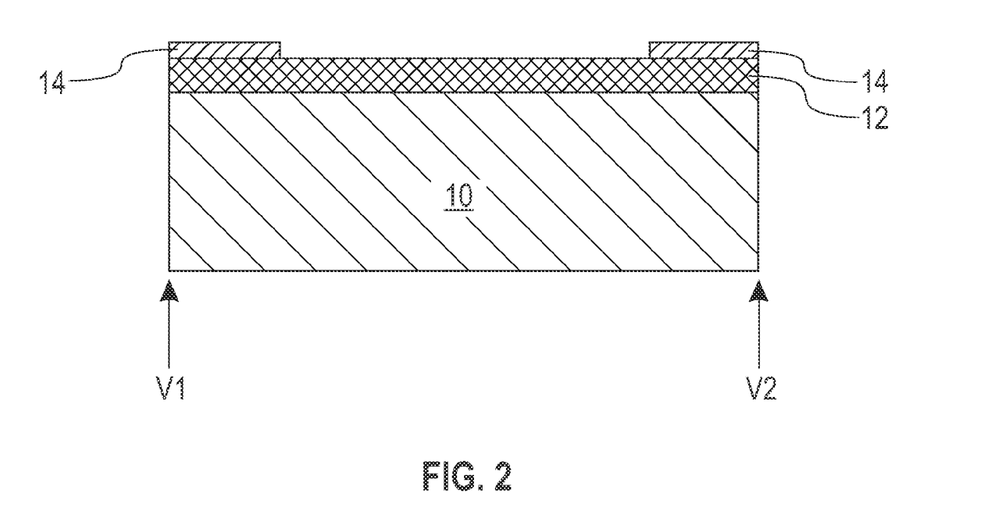
FIG. 2 is a cross sectional view of the exemplary semiconductor structure of FIG. 1 after forming an edge exclusion material on the surface of the ohmic contact layer and at the edges of the material stack in accordance with an embodiment of the present application.
Figure 3:
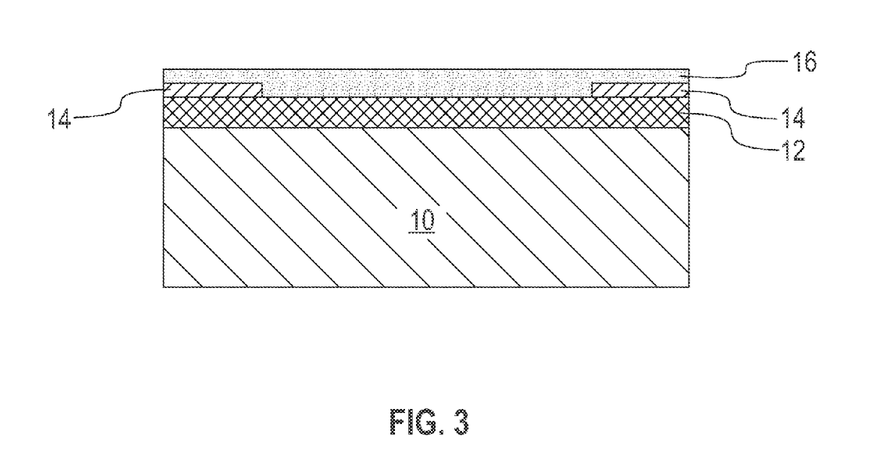
FIG. 3 is a cross sectional view of the exemplary structure of FIG. 2 after forming a metal-containing adhesion layer on exposed surfaces of the edge exclusion material and a remaining exposed surface of the ohmic contact layer in accordance with an embodiment of the present application.

Referring now to FIG. 2, there is illustrated the exemplary structure shown in FIG. 1 after forming an edge exclusion material 14 on a surface of the ohmic contact layer 12 and at the vertical edges V1, V2 of the material stack (10, 12). In some embodiments of the present application, the edge exclusion material can be omitted and the process of the present application proceeds as shown in FIG. 3. In embodiments in which an edge exclusion material 14 is present, the edge exclusion material 14 has one edge that is vertically coincident with vertical edge V1,V2 of the material stack (10, 12), while another edge of the edge exclusion material 14 is located inward from edge V1,V2 and on an exposed surface of ohmic contact layer 12.

In one embodiment of the present application, the edge exclusion material 14 can be an adhesion demoter. By "adhesion demoter" it is meant any material that reduces the ability of a subsequently formed optional metal-containing adhesion layer or stressor layer to adhere, i.e., stick, to the ohmic contact layer 12. The adhesion demoters that can be employed in the present application as the edge exclusion material 14 include, but are not limited to, photoresist materials, polymers, hydrocarbon materials, inks, powders, pastes or non-adherent metals. In one embodiment, the adhesion demoter that can be employed in the present application as the edge exclusion material 14 is an ink.

The photoresist materials that can be employed as the adhesion demoter include any well known positive-tone materials and/or negative-tone materials. The polymers that can be employed as the adhesion demoter include, but are not limited to, natural polymers such as rubbers, shellac, and cellulose, synthetic polymers such as nylon, polyethylene and polypropylene, deposited or applied in the form of tape or film. The hydrocarbon materials that can be employed as the adhesion demoter include, but are not limited to, saturated hydrocarbons (i.e., alkanes), unsaturated hydrocarbons (i.e., alkenes or alkynes), cycloalkanes, and/or aromatic hydrocarbons (i.e., arenes). Inks that can be employed as the adhesion demoter include, but are not limited to, alcohol or water-based inks commonly found in commercial permanent markers or inks used in bubble-jet printing technology. Non-adherent metals that can be employed as the adhesion demoter include, but are not limited to, Au, Ag, solders or low-melting point alloys. Pastes that can be employed as the adhesion demoter include, but are not limited to, metal based pastes, partially-cured epoxies, vacuum grease or similar materials.

The adhesion demoters that can be employed in the present application as the edge exclusion material 14 can be formed onto the ohmic contact layer 12 near edges V1, V2 of the materials stack (10, 12) utilizing techniques that are well known in the art. For example, the adhesion demoters that can be employed in the present application as the edge exclusion material 14 can be formed by chemical vapor deposition, plasma enhanced chemical vapor deposition, atomic layer deposition, spin-coating, brushing, spray coating, screen-printing, bubble-jet printing, or fabric-tip application. In some embodiments in which inks are employed as the adhesion demoters, the ink can be applied from a pen or marker containing the same. In one embodiment, the edge exclusion material 14 has a width, which is determined from one sidewall edge to another sidewall edge, of from 0.01 mm to 10 mm. In another embodiment, the edge exclusion material 14 has a width of from 0.1 mm to 5 mm. It is observed that the portion of the material stack (10, 12) that is located directly beneath the edge exclusion material 14 defines an edge exclusion region whose presence minimizes edge related breakage during a subsequent spalling process. The term "edge exclusion region" is used throughout the present application to denote an area atop the material stack (10, 12) in which a subsequently formed stressor layer is either not present or if, present, the stressor layer does not significantly adhere to the exposed surface of the ohmic contact layer 12.

Referring now to FIG. 3, there is illustrated the exemplary structure of FIG. 2 after forming an optional metal-containing adhesion layer 16 on exposed surfaces of the edge exclusion material 14 and on a remaining portion of the exposed surface of the ohmic contact layer 12. In some embodiments, and when no edge exclusion material 14 is present, the optional metal-containing adhesion layer 16 can be formed directly on the entirety of the exposed surface of the ohmic contact layer 12.

The optional metal-containing adhesion layer 16 is employed in embodiments in which the stressor layer to be subsequently formed has poor adhesion to ohmic contact layer 12. Typically, the metal-containing adhesion layer 16 is employed when a stressor layer comprised of a metal is employed. In some embodiments, an optional plating seed layer (not shown) can be formed directly atop the exposed surface of the ohmic contact layer 12. The optional plating seed layer can be used together with the metal-containing adhesion layer 16 or in lieu thereof. When the optional plating seed layer is employed in conjunction with the edge exclusion material 14, the edge exclusion material 14 is applied to the ohmic contact layer 12 prior to deposition of the plating seed layer.

The optional metal-containing adhesion layer 16 that can be employed in the present application includes any metal adhesion material such as, but not limited to, Ti/W, Ti, and Cr, Ni or any combination thereof. The optional metal-containing adhesion layer 16 may comprise a single layer or it may include a multilayered structure comprising at least two layers of different metal adhesion materials.

When present, the optional metal-containing adhesion layer 16 can be formed at a temperature from 15° C. to 40° C., i.e., 288K to 313K, or above. In one embodiment, the optional metal-containing adhesion layer 16 can be formed at a temperature which is from 20° C. (293K) to 180° C. (353K). In another embodiment, the optional metal-containing adhesion layer 16 can be formed at a temperature which is from 20° C. (293K) to 60° C. (333K).

The metal-containing adhesion layer 16, which may be optionally employed, can be formed utilizing deposition techniques that are well known to those skilled in the art. For example, the optional metal-containing adhesion layer 16 can be formed by sputtering, chemical vapor deposition, plasma enhanced chemical vapor deposition, chemical solution deposition, physical vapor deposition, or plating. When sputter deposition is employed, the sputter deposition process may further include an in-situ sputter clean process before the deposition.

When employed, the optional metal-containing adhesion layer 16 typically has a thickness from 5 nm to 300 nm, with a thickness from 100 nm to 150 nm being more typical. Other thicknesses for the optional metal-containing adhesion layer 16 that are below and/or above the aforementioned thickness ranges can also be employed in the present application.

The optional plating seed layer (not shown) is typically employed in embodiments in which the stressor layer to be subsequently formed is a metal and plating is used to form the metal-containing stressor layer. The optional plating seed layer is employed to selectively promote subsequent plating of a pre-selected metal-containing stressor layer. The optional plating seed layer may comprise, for example, a single layer of Ni or a layered structure of two or more metals such as Ti/Ni, Ti/Ag, Ti/Au, Cr/Ni, Cr/Ag, Cr/Au, Al(bottom)/Ti/Ni (top), etc. The thickness of the optional plating seed layer may vary depending on the material or materials of the optional plating seed layer as well as the technique used in forming the same. Typically, the optional plating seed layer has a thickness from 2 nm to 1 micron. The optional plating seed layer can be formed by a conventional deposition process including, for example, chemical vapor deposition (CVD), plasma-enhanced chemical vapor deposition (PECVD), atomic layer deposition (ALD), or physical vapor deposition (PVD) techniques that may include evaporation and/or sputtering.

In accordance with the present application, the optional metal-containing adhesion layer 16 and/or the optional plating seed layer is (are) formed at a temperature which does not effectuate spontaneous spalling to occur within single crystalline semiconductor base substrate 10.

Figure 4:
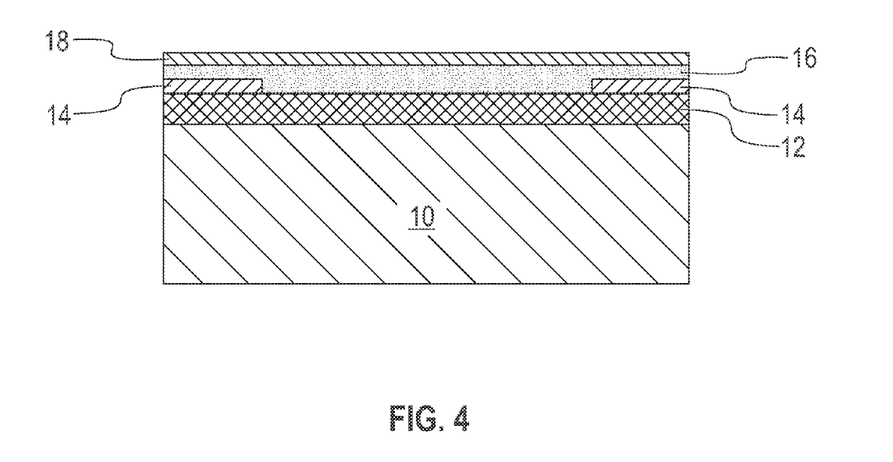
FIG. 4 is a cross sectional view of the exemplary structure of FIG. 3 after forming a stressor layer on a surface of the metal-containing adhesion layer in accordance with an embodiment of the present application.

Referring now to FIG. 4, there is illustrated the exemplary structure of FIG. 3 after forming a stressor layer 18 on an upper surface of the optional metal-containing adhesion layer 16. In some embodiments in which the optional metal-containing adhesion layer 16 and edge exclusion material 14 are not present, the stressor layer 18 can be formed directly on an exposed surface ohmic contact layer 12; this particular embodiment is not shown in the drawings, but can readily be deduced from the drawings illustrated in the present application. In other embodiments in which an optional plating seed layer is employed, the stressor layer 18 can be formed directly on the upper surface of the optional plating seed layer; this particular embodiment is also not shown in the drawings, but can readily be deduced from the drawings illustrated in the present application.

The stressor layer 18 that can be employed in the present application includes any material that is under tensile stress on the material stack (10,12) after deposition. The stressor layer 18 can also be referred to a stress inducing layer. In accordance with the present application, the stressor layer 18 has a critical thickness and a stress value that cause spalling mode fracture to occur within the single crystalline semiconductor base substrate 10. In particular, the stressor layer 18 has a critical thickness in which spalling is initiated below the interface between the ohmic contact layer 12 and the single crystalline semiconductor base substrate 10 and somewhere within the single crystalline semiconductor base substrate 10. By 'critical', it is meant that for a given stressor material and base substrate material combination, a thickness value and a stressor value for the stressor layer is chosen that render spalling mode fracture possible (can produce a $K_I$ value greater than the $K_{IC}$ of the substrate). The stress value can be adjusted by tuning the deposition conditions of the stressor layer 18. For example, in the case of sputter deposition of stressor layer 18, the gas pressure can be used to tune the stress value as described in Thorton and Hoffman, *J. Vac. Sci. Technol.*, 14 (1977) p. 164.

The thickness of the stressor layer 18 is chosen to provide the desired fracture depth somewhere within the single crystalline semiconductor base substrate 10. For example, if the stressor layer 18 is chosen to be Ni, then fracture will occur at a depth below the stressor layer 18 roughly 2 to 3 times the Ni thickness. The stress value for the stressor layer 18 is then chosen to satisfy the critical condition for spalling mode fracture. This can be estimated by inverting the empirical equation given by $t^*=[(2.5\times10^6)(K_{IC}^{3/2})]/\sigma^2$, where $t^*$ is the critical stressor layer thickness (in microns), $K_{IC}$ is the fracture toughness (in units of MPa·m$^{1/2}$) of the base substrate 10 and $\sigma$ is the stress value of the stressor layer (in MPa or megapascals). The above expression is a guide, in practice, spalling can occur at stress or thickness values up to 20% less than that predicted by the above expression.

Illustrative examples of such materials that are under tensile stress when applied atop materials stack (10, 12) and thus can be employed as the stressor layer 18 include, but are not limited to, a metal, a polymer, such as a spall inducing tape layer, or any combination thereof. The stressor layer 18 may comprise a single stressor layer, or a multilayered stressor structure including at least two layers of different stressor material can be employed.

In one embodiment, the stressor layer 18 is a metal, and the metal is formed on an upper surface of the optional metal-containing adhesion layer 16. In another embodiment, the stressor layer 18 is a spall inducing tape, and the spall inducing tape is applied directly to the ohmic contact layer 12. In another embodiment, for example, the stressor layer 18 may comprise a two-part stressor layer including a lower part and an upper part. The upper part of the two-part stressor layer can be comprised of a spall inducing tape layer.

When a metal is employed as the stressor layer 18, the metal can include, for example, Ni, Cr, Fe, Mo, Ti or W. Alloys of these metals can also be employed. In one embodiment, the stressor layer 18 includes at least one layer consisting of Ni.

When a polymer is employed as the stressor layer 18, the polymer is a large macromolecule composed of repeating structural units. These subunits are typically connected by covalent chemical bonds. Illustrative examples of polymers that can be employed as the stressor layer 18 include, but are not limited to, polyimides polyesters, polyolefins, polyacrylates, polyurethane, polyvinyl acetate, or polyvinyl chloride.

When a spall inducing non-metallic layer (i.e. polymeric materials such as a tape) is employed as the stressor layer 18, the spall inducing layer includes any pressure sensitive tape that is flexible, soft, and stress free at a first temperature used to form the tape, yet strong, ductile and tensile at a second temperature used during removal, i.e., spalling of an upper portion of the single crystalline semiconductor base substrate 10. By "pressure sensitive tape," it is meant an adhesive tape that will stick with application of pressure, without the need for solvent, heat, or water for activation. Tensile stress in the tape at the second temperature is primarily due to thermal expansion mismatch between the material stack (10, 12) (with a lower thermal coefficient of expansion) and the tape (with a higher thermal expansion coefficient).

Typically, the pressure sensitive tape that is employed in the present application as stressor layer 18 includes at least an adhesive layer and a base layer. Materials for the adhesive layer and the base layer of the pressure sensitive tape include polymeric materials such as, for example, acrylics, polyesters, olefins, and vinyls, with or without suitable plasticizers. Plasticizers are additives that can increase the plasticity of the polymeric material to which they are added.

In one embodiment, the stressor layer 18 employed in the present application is formed at room temperature (15° C.-40° C., i.e., 288K-313K). In another embodiment, when a tape layer is employed, the tape layer can be formed at a temperature from 15° C. (288K) to 60° C. (333K).

When the stressor layer 18 is a metal or polymer, the stressor layer 18 can be formed utilizing deposition techniques that are well known to those skilled in the art including, for example, dip coating, spin-coating, brush coating, sputtering, chemical vapor deposition, plasma enhanced chemical vapor deposition, chemical solution deposition, physical vapor deposition, or plating.

When the stressor layer 18 is a spall inducing tape layer, the tape layer can be applied by hand or by mechanical means to the structure. The spall inducing tape can be formed utilizing techniques well known in the art or they can be commercially purchased from any well known adhesive tape manufacturer. Some examples of spall inducing tapes that can be used in the present application as stressor layer 18 include, for example, Nitto Denko 3193MS thermal release tape, Kapton KPT-1, and Diversified Biotech's CLEAR-170 (acrylic adhesive, vinyl base).

In one embodiment, a two-part stressor layer can be formed on the ohmic contact layer 12, wherein a lower part of the two-part stressor layer is formed at a first temperature which is at room temperature or slight above (e.g., from 15° C. (288K) to 60° C. (333K)), wherein an upper part of the two-part stressor layer comprises a spall inducing tape layer at an auxiliary temperature which is at room temperature.

If the stressor layer 18 is of a metallic nature, it typically has a thickness of from 1 µm to 50 µm, with a thickness of from 4 µm to 7 µm being more typical. Other thicknesses for the stressor layer 18 that are below and/or above the aforementioned thickness ranges can also be employed in the present application.

If the stressor layer 18 is of a polymeric nature, it typically has a thickness of from 10 µm to 200 µm, with a thickness of from 50 µm to 100 µm being more typical. Other thicknesses for the stressor layer 18 that are below and/or above the aforementioned thickness ranges can also be employed in the present application.

Figure 5:
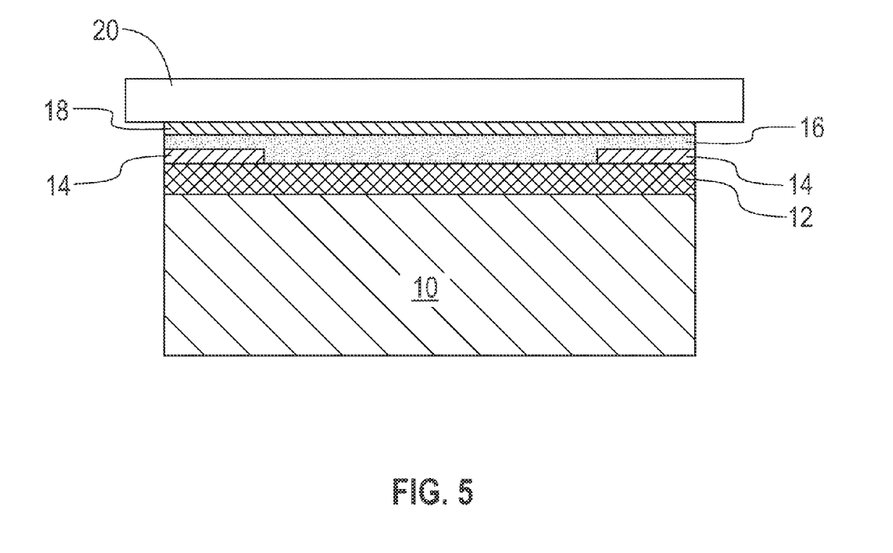
FIG. 5 is a cross sectional view of the exemplary structure of FIG. 4 after forming a handle substrate on a surface of the stressor layer in accordance with an embodiment of the present application.

Referring now to FIG. 5, there is illustrated the exemplary structure of FIG. 4 after forming a handle substrate 20 atop the stressor layer 18. In some embodiments of the present application, the handle substrate 20 can be omitted. When present, the handle substrate 20 can include any flexible material which has a minimum radius of curvature of less than 30 cm. Illustrative examples of flexible materials that can be employed as the handle substrate 20 include a metal foil or a polyimide foil.

The handle substrate 20 can be used to provide better fracture control and more versatility in handling the spalled portion of the single crystalline semiconductor base substrate 10. Moreover, the handle substrate 20 can be used to guide the crack propagation during a subsequently performed spalling process. The handle substrate 20 of the present application is typically, but not necessarily, formed at a first temperature which is at room temperature (15° C. (288K)-40° C. (313K)).

The handle substrate 20 can be formed utilizing deposition techniques that are well known to those skilled in the art including, for example, mechanical pressure, dip coating, spin-coating, brush coating, sputtering, chemical vapor deposition, plasma enhanced chemical vapor deposition, chemical solution deposition, physical vapor deposition, or plating.

The handle substrate 20 typical has a thickness of from 5 µm to 500 µm, with a thickness of from 10 µm to 150 µm being more typical. Other thicknesses for the handle substrate 20 that are below and/or above the aforementioned thickness ranges can also be employed in the present application. As shown, the handle substrate 20 typically has a length that extends beyond the length of the material stack (10, 12).

Figure 6:
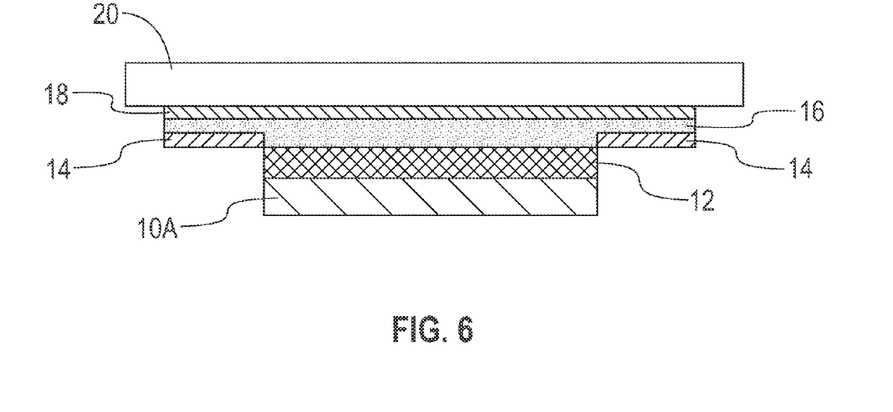
FIG. 6 is a cross sectional view of the exemplary structure of FIG. 5 after performing a spalling process in accordance with an embodiment of the present application.

Referring now to FIG. 6, there is illustrated the exemplary structure of FIG. 5 after removing an upper portion of the single crystalline semiconductor base substrate 10 by spalling. In one embodiment of the present application, the spalling process includes pulling or peeling the handle substrate 20 to remove a thin film structure that includes at least the stressor layer 18, the ohmic contact layer 12 and an upper portion of the single crystalline semiconductor base substrate 10. The upper portion of the single crystalline semiconductor base substrate 10 that is removed by spalling may be referred herein as a spalled single crystalline semiconductor material portion 10A. In this embodiment and due to the presence of the edge exclusion material 14, portions of the ohmic contact layer 12 that are located directly beneath the edges exclusion material 14 are not present in the thin film structure.

The spalling process includes crack formation and propagation within the single crystalline semiconductor base substrate 10. The spalling process is initiated at substantially room temperature (i.e., 15° C. to 40° C.). In other embodiments, spalling can be performed at a temperature from 100° C. and below. In some embodiments of the present application, spalling can be initiated by lowering the temperature at a fixed continuous rate. By "fixed continuous rate" it is mean, for example, 20° C. per second utilizing an electronically controlled cooling table or chamber. This method of cooling allows one to reach a pre-specified temperature at which user-defined spalling initiation can induce a pre-determined spalling depth that may be different than that dictated by mere structural parameters (i.e., stressor layer stress and thickness, and fracture toughness of substrate).

The thickness of the spalled single crystalline semiconductor material portion 10A that is removed from the single crystalline semiconductor base substrate 10 varies depending on the material of the stressor layer 18 and the semiconductor material of the base substrate 10 itself. In one embodiment, the spalled single crystalline semiconductor material portion 10A that is removed from the base substrate 10 has a thickness of less than 100 microns. In another embodiment, the spalled single crystalline semiconductor material portion 10A that is removed from the base substrate 10 has a thickness of less than 50 microns.

In some embodiments of the present application, various materials can be removed from above the ohmic contact layer 12 of the thin film structure shown in FIG. 6. In some embodiments of the present application, this step may be entirely omitted. The various materials (i.e., any of the handle substrate 20, the stressor layer 18, the plating seed layer, the metal-containing adhesion layer 16, and the edge exclusion material 14) can be removed utilizing conventional techniques well known to those skilled in the art. For example, and in one embodiment, aqua regia ($HNO_3/HCl$) can be used for removing the handle substrate 20, the stressor layer 18, the plating seed layer, and the metal-containing adhesion layer 16. In another example, UV or heat treatment is used to remove the handle substrate 20 followed by a chemical etch to remove the stressor layer 18, followed by a different chemical etch to remove the plating seed layer, and/or the metal-containing adhesion layer 16. The edge exclusion material 14 can be removed utilizing an organic solvent such, for example, as acetone.

In embodiments in which all the various materials are removed from atop the ohmic contact layer 12, a metal contact layer such as, for example, Ni, can be reapplied to the surface of the ohmic contact layer 12 utilizing techniques well known to those skilled in the art. Typically, and as shown in FIG. 7, at least handle substrate 20 is removed prior to further processing of the thin film structure (10A, 12).

Figure 7:
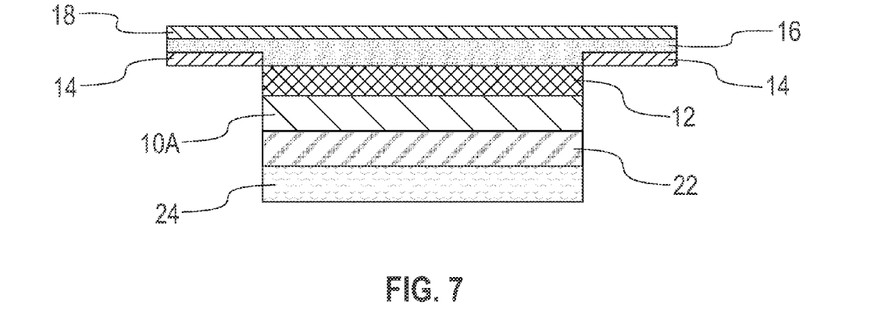
FIG. 7 is a cross sectional view of the exemplary structure of FIG. 6 after formation of a transparent conductive oxide and an antireflective coating on an exposed surface of a spalled single crystalline semiconductor material portion of the single crystalline semiconductor base substrate in accordance with an embodiment of the present application.

Referring now to FIG. 7, there is illustrated the exemplary structure of FIG. 6 after formation of a transparent conductive oxide 22 and an antireflective coating 24 on an exposed surface of a spalled single crystalline semiconductor material portion 10A of the single crystalline semiconductor base substrate 10 in accordance with an embodiment of the present application. In this structure, the transparent conductive oxide 22 can form a rectifying junction with the exposed surface of the spalled single crystalline semiconductor material portion 10A. The structure shown in FIG. 7 may be referred to as a Schottky barrier thin film photovoltaic cell.

In one embodiment and as shown, the transparent conductive oxide 22 is a continuous layer that spans the entirety of the exposed surface of the spalled single crystalline semiconductor material portion 10A. The transparent conductive oxide 22 that can be employed in the present application is comprised of an oxide material that is optically transparent and electrically conductive. Examples of such oxides that can be employed as the transparent conductive oxide 22 include, but are not limited to, indium tin oxide (ITO); fluorine doped tin oxide (FTO), doped zinc oxide, aluminum-doped zinc oxide, tin oxide, or multilayers thereof. The transparent conductive oxide 22 can be formed utilizing a deposition process including, for example, chemical vapor deposition or sputtering. The thickness of the transparent conductive oxide 22 that is formed can be from 20 nm to 500 nm. Other thicknesses that are lesser than or greater than the aforementioned thickness range can also be employed for the transparent conductive oxide.

The antireflective coating (ARC) 24 is an optical coating that is applied to the transparent conductive oxide 22 to reduce reflection. This improves the efficiency of the system since less light is lost. The ARC 24 that can be used in the present application may comprise an organic ARC and/or an inorganic ARC. In one embodiment of the present application, the ARC 24 can be silicon nitride and/or silicon dioxide. The ARC 24 can be formed utilizing a deposition process such as, for example, chemical vapor deposition, plasma enhanced chemical vapor deposition, evaporation or spin on coating. The thickness of the ARC 24 can be from 10 nm to 20 nm. Other thicknesses that are lesser than or greater than the aforementioned thickness range can also be employed for the ARC 24.

Referring now to FIGS. 8A, 8B, 9, 10, and 11, there are illustrated other exemplary structures that can be formed utilizing the basic processing steps described above and illustrated in FIGS. 1-6. In these other structures, the stressor layer 18 was formed directly on the ohmic contact layer 12. In some of the embodiments that follow, the semiconductor material that is disposed beneath an exposed surface of a spalled single crystalline semiconductor material portion 10A of the single crystalline semiconductor base substrate 10 is formed without utilizing epitaxial growth to significantly reduce the cost and increase manufacturing throughput for solar cells.

Figure 8A:
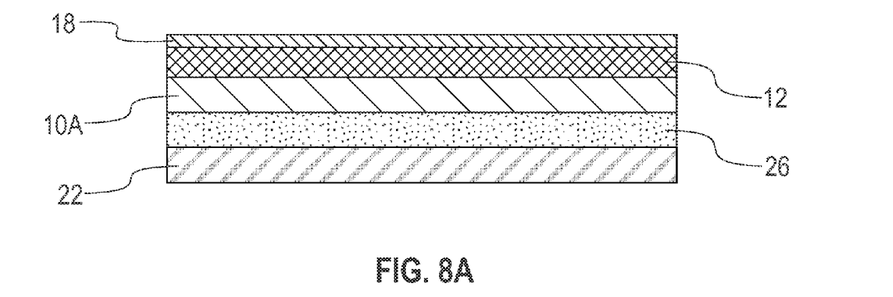
FIG. 8A is a cross sectional view of another exemplary structure that includes an amorphous semiconductor material of a second conductivity type and a transparent conductive oxide disposed beneath on an exposed surface of a spalled single crystalline semiconductor material portion of the single crystalline semiconductor base substrate in accordance with an embodiment of the present application.

Referring first to FIG. 8A, there is illustrated another exemplary structure of the present application that includes an amorphous semiconductor material 26 of a second conductivity type and a transparent conductive oxide 22 disposed beneath an exposed surface of a spalled single crystalline semiconductor material portion 10A of the single crystalline semiconductor base substrate 10 in accordance with an embodiment of the present application. In this embodiment, the spalled single crystalline semiconductor material portion 10A is part of a thin film structure that also includes ohmic contact layer 12, and stressor layer 18. The structure shown in FIG. 8A may be referred to as a HIT thin film photovoltaic cell with an amorphous semiconductor junction.

In this embodiment of the present application, the amorphous semiconductor material 26 of the second conductivity type is formed directly on the exposed surface of the spalled single crystalline semiconductor material portion 10A and the transparent conductive oxide 22 is formed directly on the amorphous semiconductor material 26. In this embodiment, the second conductivity type is of opposite conductivity as compared to the first conductivity type mentioned above. In one embodiment, the dopant that provides the second conductivity type is present in the amorphous semiconductor material 26 in a concentration ranging from 1E17 atoms/cm$^3$ to 1E19 atoms/cm$^3$.

The term "amorphous" denotes that the semiconductor material that provides the amorphous semiconductor material 26 is a non-crystalline material that lacks the long-range order characteristic of a crystal. In one embodiment of the present application, the semiconductor material that provides the amorphous semiconductor material 26 is comprised of a same semiconductor material as the spalled single crystalline semiconductor material portion 10A. In another embodiment, the semiconductor material that provides the amorphous semiconductor material 26 is comprised of a different semiconductor material as the spalled single crystalline semiconductor material portion 10A. For example, the amorphous semiconductor material 26 may comprise Si or SiGe, and the spalled single crystalline semiconductor material portion 10A may comprise one of InP, InGaAs or germanium.

The amorphous semiconductor material 26 may be formed utilizing any known deposition process including, for example, CVD, PECVD or MOCVD. The dopant that provides the second conductivity type to the amorphous semiconductor material 26 can be introduced during the deposition of the amorphous semiconductor material 26 or the dopants can be introduced after deposition by utilizing one of ion implantation or gas phase doping. The amorphous semiconductor material 26 can have a thickness from 2 nm to 20 nm. Other thicknesses are also possible for the amorphous semiconductor material 26.

The transparent conductive oxide 22 used in this embodiment of the present application includes one of the materials mentioned above in providing the structure shown in FIG. 7 of the present application. The transparent conductive oxide 22 used in this embodiment can be formed as described above and it may also have a thickness in the range also described above.

Figure 8B:
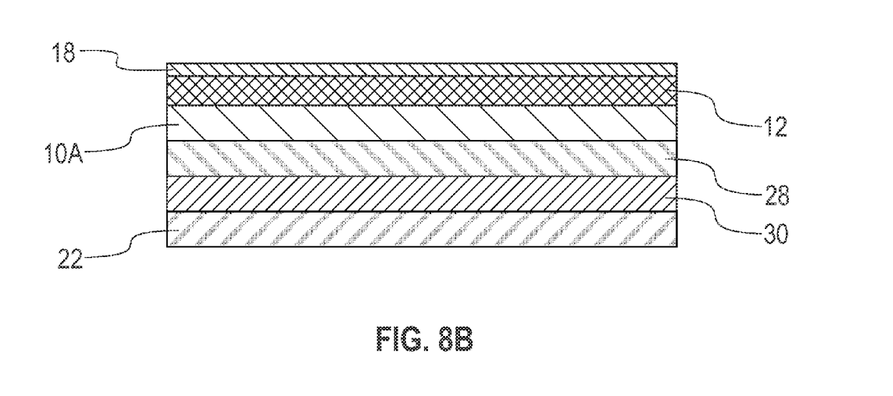
FIG. 8B is a cross sectional view of another exemplary structure that includes an amorphous semiconductor material that is intrinsic, an amorphous semiconductor material of a second conductivity type that is opposite the first conductivity type and a transparent conductive oxide disposed beneath an exposed surface of a spalled single crystalline semiconductor material portion of the single crystalline semiconductor base substrate in accordance with an embodiment of the present application.

Referring now to FIG. 8B, there is illustrated another exemplary structure of the present application that includes an amorphous semiconductor material 28 that is intrinsic, an amorphous semiconductor material 30 of a second conductivity type that is opposite the first conductivity type and a transparent conductive oxide 22 disposed beneath an exposed surface of a spalled single crystalline semiconductor material portion 10A of the single crystalline semiconductor base substrate 10 in accordance with an embodiment of the present application. In this embodiment, the spalled single crystalline semiconductor material portion 10A is part of a thin film structure that also includes ohmic contact layer 12, and stressor layer 18. The structure shown in FIG. 8B may be also referred to as a HIT thin film photovoltaic cell with an amorphous semiconductor junction. In one embodiment, the dopant that provides the second conductivity type is present in the amorphous semiconductor material 26 in a concentration ranging from 1E17 atoms/cm$^3$ to 1E19 atoms/cm$^3$.

The term "intrinsic" when used in conjunction with the amorphous semiconductor material 28 denotes that the amorphous semiconductor material 28 lacks any dopant or has a dopant concentration that is less than 1E14 atoms/cm$^3$. In one embodiment of the present application, the semiconductor material that provides the amorphous semiconductor material 28 is comprised of a same semiconductor material as the spalled single crystalline semiconductor material portion 10A. In another embodiment, the semiconductor material that provides the amorphous semiconductor material 28 is comprised of a different semiconductor material as the spalled single crystalline semiconductor material portion 10A. For example, the amorphous semiconductor material 28 may comprise Si or SiGe, and the spalled single crystalline semiconductor material portion 10A may comprise one of InP, InGaAs or germanium.

The amorphous semiconductor material 28 may be formed utilizing any known deposition process including, for example, CVD, PECVD or MOCVD. When epitaxial growth is used in providing the amorphous semiconductor material 28, the amorphous semiconductor material 28 has an epitaxial relationship with the exposed surface of the spalled single crystalline semiconductor portion 10A. The amorphous semiconductor material 28 can have a thickness from 2 nm to 20 nm. Other thicknesses are also possible for the amorphous semiconductor material 28.

The amorphous semiconductor material 30 of the second conductivity type that is opposite the first conductivity type that is employed in this embodiment of the present application includes materials, dopant concentrations, and thicknesses as mentioned above for the amorphous semiconductor material 26 in the previous embodiment of the present application.

The transparent conductive oxide 22 used in this embodiment of the present application includes one of the materials mentioned above in providing the structure shown in FIG. 7 of the present application. The transparent conductive oxide 22 used in this embodiment can be formed as described above and it may also have a thickness in the range also described above.

Figure 9:
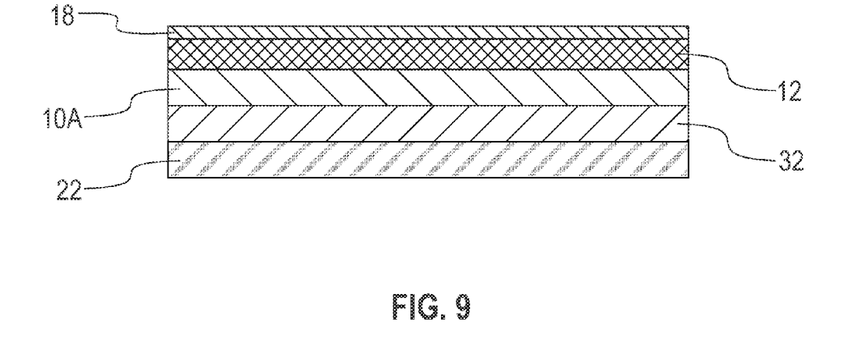
FIG. 9 is a cross sectional view of another exemplary structure that includes a semiconductor material and a transparent conductive oxide disposed beneath an exposed surface of a spalled single crystalline semiconductor material portion of the single crystalline semiconductor base substrate in accordance with an embodiment of the present application.

Referring now to FIG. 9, there illustrated another exemplary structure of the present application that includes a semiconductor material 32 and a transparent conductive oxide 22 disposed beneath an exposed surface of a spalled single crystalline semiconductor material portion 10A of the single crystalline semiconductor base substrate 10 in accordance with an embodiment of the present application. In this embodiment, the spalled single crystalline semiconductor material portion 10A is part of a thin film structure that also includes ohmic contact layer 12, and stressor layer 18. Also, and in this embodiment, the semiconductor material 32 has a different lattice constant than the lattice constant of the spalled single crystalline semiconductor material portion 10A. As such, the structure shown in FIG. 9 may be referred to as a heterojunction thin film photovoltaic cell.

The semiconductor material 32 thus comprises a different semiconductor material as compared to the semiconductor material that provides the spalled single crystalline semiconductor material portion 10A. For example, the semiconductor material 32 may comprise Si or SiGe, and the spalled single crystalline semiconductor material portion 10A may comprise one of InP, InGaAs or germanium. The semiconductor material that provides semiconductor material 32 may be single crystalline, polycrystalline or amorphous. The semiconductor material 32 may be intrinsic or doped. In one embodiment, the dopant type that may be present in the semiconductor material 32 can be the same as the first conductivity type present in the spalled single crystalline semiconductor material portion 10A. In another embodiment, the dopant type that may be present in the semiconductor material 32 can be an opposite conductivity type than the first conductivity type present in the spalled single crystalline semiconductor material portion 10A.

The semiconductor material 32 may be formed utilizing any known deposition process including, for example, CVD, PECVD or MOCVD. The semiconductor material 32 can have a thickness from 2 nm to 20 nm. Other thicknesses are also possible for the amorphous semiconductor material 28.

The transparent conductive oxide 22 used in this embodiment of the present application includes one of the materials mentioned above in providing the structure shown in FIG. 7 of the present application. The transparent conductive oxide 22 used in this embodiment can be formed as described above and it may also have a thickness in the range also described above.

Figure 10:
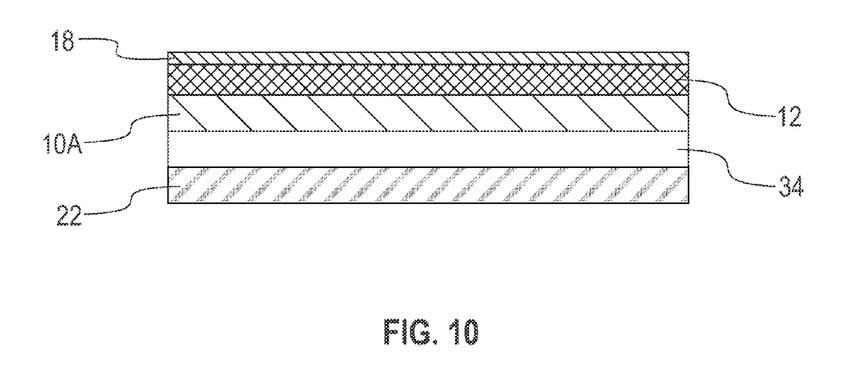
FIG. 10 is a cross sectional view of another exemplary structure that includes an insulating layer and a transparent conductive oxide disposed beneath an exposed surface of a spalled single crystalline semiconductor material portion of the single crystalline semiconductor base substrate in accordance with an embodiment of the present application.

Referring now to FIG. 10, there is illustrated another exemplary structure of the present application that includes an insulating layer 34 and a transparent conductive oxide 22 disposed beneath an exposed surface of a spalled single crystalline semiconductor material portion 10A of the single crystalline semiconductor base substrate 10 in accordance with an embodiment of the present application. In this embodiment, the spalled single crystalline semiconductor material portion 10A is part of a thin film structure that also includes ohmic contact layer 12, and stressor layer 18. The structure shown in FIG. 10 may be referred to as a MIS (metal-on-insulator) thin film photovoltaic cell.

In this embodiment, insulating layer 34 comprises a tunneling barrier such as, for example, a metal oxide, a semiconductor oxide, an amorphous silicon layer and/or a polycrystalline semiconductor layer. The insulating layer 34 may be formed utilizing any known deposition process including, for example, chemical vapor deposition. The insulating layer 34 can have a thickness from 2 nm to 20 nm. Other thicknesses are also possible for the insulating layer 34.

The transparent conductive oxide 22 used in this embodiment of the present application includes one of the materials mentioned above in providing the structure shown in FIG. 7 of the present application. The transparent conductive oxide 22 used in this embodiment can be formed as described above and it may also have a thickness in the range also described above.

Figure 11:
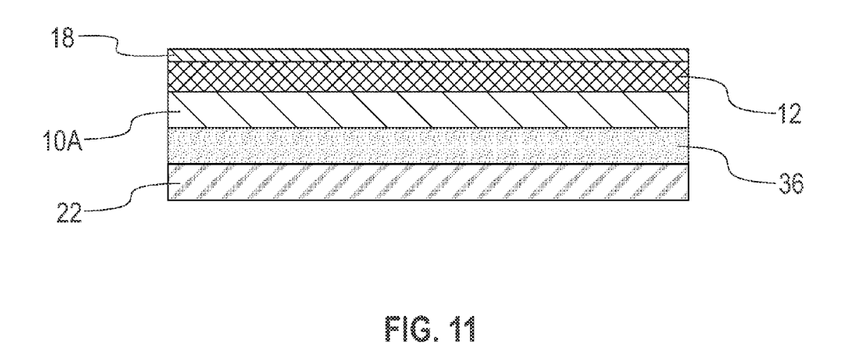
FIG. 11 is a cross sectional view of another exemplary structure that includes a window layer and a transparent conductive oxide disposed beneath an exposed surface of a spalled single crystalline semiconductor material portion of the single crystalline semiconductor base substrate in accordance with an embodiment of the present application.

Referring now to FIG. 11, there is illustrated another exemplary structure of the present application that includes a window layer 36 and a transparent conductive oxide 22 disposed beneath an exposed surface of a spalled single crystalline semiconductor material portion 10A of the single crystalline semiconductor base substrate 10 in accordance with an embodiment of the present application. In this embodiment, the spalled single crystalline semiconductor material portion 10A is part of a thin film structure that also includes ohmic contact layer 12, and stressor layer 18. The structure shown in FIG. 11 may be referred to as a Schottky barrier thin film photovoltaic cell with a window layer. The window layer is a conductive semiconductor layer with a wide bandgap on top of the light absorption material in a solar cell. The window layer allows most of the sun light can pass through and help to collect electron/holes generated in the absorption layer by light absorption. A window layer is different from a tunneling layer which is a very thin non-conductive dielectric layer that passivates the solar cell surface and allows electron/holes to tunnel through.

In this embodiment, window layer 36 comprises a light transparent material such as, for example, an oxide layer or a semiconductor material having a wider band gap than a band gap of the spalled single crystalline semiconductor material portion 10A. The window layer 36 may be formed utilizing any known deposition process including, for example, chemical vapor deposition. The window layer 36 can have a thickness from 2 nm to 200 nm. Other thicknesses are also possible for the window layer 36.

The transparent conductive oxide 22 used in this embodiment of the present application includes one of the materials mentioned above in providing the structure shown in FIG. 7 of the present application. The transparent conductive oxide 22 used in this embodiment can be formed as described above and it may also have a thickness in the range also described above.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a thin film photovoltaic cell, said method comprising:
   providing a material stack of, from bottom to top, a single crystalline semiconductor base substrate of a first conductivity type and having a surface Fermi level pinned close to a band edge, and an ohmic contact layer;
   forming a stressor layer above said ohmic contact layer;
   removing a portion of said single crystalline semiconductor base substrate by performing a spalling process to provide a thin film structure that comprises, from bottom to top, a spalled single crystalline semiconductor material portion of said single crystalline semiconductor base substrate, said ohmic contact layer and said stressor layer; and
   forming at least a transparent conductive oxide layer on an exposed surface of said spalled single crystalline semiconductor material portion.

2. The method of claim 1, further comprising forming an edge exclusion material on a surface of said ohmic contact layer and at each vertical edge of said material stack prior to forming said stressor layer.

3. The method of claim 2, wherein said edge exclusion material comprises a photoresist material, a polymer, a hydrocarbon material, an ink, a metal, or a paste.

4. The method of claim 1, further comprising forming a handle substrate on an exposed surface of said stressor layer prior to performing said spalling process.

5. The method of claim 4 wherein said spalling process further comprises pulling or peeling said handle substrate.

6. The method of claim 1, wherein said spalling process is performed at room temperature.

7. The method of claim 1, wherein said stressor layer comprises a metal, a polymer, a spalling inducing tape or any combination thereof.

8. The method of claim 1, wherein said stressor layer comprises Ni.

9. The method of claim 1, wherein said ohmic contact layer comprises a semiconductor metal alloy having a dopant of said first conductivity type.

10. The method of claim 1, wherein said transparent conductive oxide layer is formed directly on said exposed surface of said spalled single crystalline semiconductor material portion.

11. The method of claim 10, further comprising forming an antireflective coating on an exposed surface of said transparent conductive oxide layer.

12. The method of claim 1, further comprising forming an amorphous semiconductor layer of a second conductivity type on said exposed surface of said spalled single crystalline semiconductor material portion, wherein said second conductivity type is opposite said first conductivity type.

13. The method of claim 12, further comprising forming an intrinsic amorphous semiconductor material layer between said amorphous semiconductor layer of said second conductivity type and said exposed surface of said spalled single crystalline semiconductor material portion.

14. The method of claim 1, further comprising forming a semiconductor layer having a lattice contact that differs from a lattice constant of said spalled single crystalline semiconductor material portion between said exposed surface of said spalled single crystalline semiconductor material portion and said transparent conductive oxide layer.

15. The method of claim 1, further comprising forming an insulating layer between said exposed surface of said spalled single crystalline semiconductor material portion and said transparent conductive oxide layer.

16. The method of claim 1, further comprising further forming a light transparent window layer between said exposed surface of said spalled single crystalline semiconductor material portion and said transparent conductive oxide layer.

17. The method of claim 16, wherein said light transparent window layer is selected from an oxide layer and a semiconductor material having a wider band gap than a band gap of said spalled single crystalline semiconductor material portion.

18. The method of claim 1, wherein said stressor layer is formed in direct contact with a topmost surface of said ohmic contact layer.

19. The method of claim 1, wherein said single crystalline semiconductor base substrate is not formed utilizing an epitaxial growth process.

20. The method of claim 1, wherein said single crystalline semiconductor base substrate is selected from InP, InGaAs and germanium.

* * * * *